US009634049B2

United States Patent
Chang et al.

(10) Patent No.: US 9,634,049 B2
(45) Date of Patent: Apr. 25, 2017

(54) SOLID-STATE IMAGING DEVICES WITH ENHANCED ANGULAR RESPONSE

(71) Applicant: VisEra Technologies Company Limited, Hsin-Chu (TW)

(72) Inventors: Chih-Chieh Chang, Taichung (TW); Chi-Han Lin, Zhubei (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 14/861,378

(22) Filed: Sep. 22, 2015

(65) Prior Publication Data

US 2017/0084652 A1  Mar. 23, 2017

(51) Int. Cl.
*H01L 27/146* (2006.01)

(52) U.S. Cl.
CPC .. *H01L 27/14623* (2013.01); *H01L 27/14621* (2013.01); *H01L 27/14645* (2013.01)

(58) Field of Classification Search
CPC ......... H01L 27/14623; H01L 27/14621; H01L 27/14635
See application file for complete search history.

(56) References Cited

U.S. PATENT DOCUMENTS

| 2009/0035887 A1 | 2/2009 | Suzuki et al. |
| 2010/0110271 A1 | 5/2010 | Yanagita et al. |
| 2010/0207225 A1* | 8/2010 | Masuda ............. H01L 31/0232 257/432 |
| 2010/0282945 A1 | 11/2010 | Yokogawa |
| 2011/0121422 A1* | 5/2011 | Saitou ................ G02B 3/0056 257/432 |
| 2011/0241145 A1 | 10/2011 | Lenchenkov |
| 2012/0007204 A1 | 1/2012 | Hsu et al. |
| 2012/0267744 A1* | 10/2012 | Tsuji ................ H01L 27/14621 257/432 |

(Continued)

FOREIGN PATENT DOCUMENTS

| JP | 2000036587 A | 2/2000 |
| JP | 2006324354 A | 11/2006 |

(Continued)

OTHER PUBLICATIONS

Taiwanese Office Action dated Dec. 23, 2015, as issued in corresponding Taiwan Patent Application No. 103127725 (6 pages).

(Continued)

*Primary Examiner* — John C Ingham
*Assistant Examiner* — Gustavo Ramallo
(74) *Attorney, Agent, or Firm* — Muncy, Geissler, Olds & Lowe, P.C.

(57) ABSTRACT

A solid-state imaging device includes a substrate containing a plurality of photoelectric conversion elements arranged into a pixel array. A color filter layer including a plurality of color filter segments is disposed above the photoelectric conversion elements. A partition grid includes a plurality of partitions, and each of the partitions is disposed between two adjacent color filter segments. The color filter layer and the partition grid are disposed in the same layer. In addition, the partitions include a first partition disposed at a center line of the pixel array and a second partition disposed at an edge of the pixel array. The second partition has a top width that is larger than the top width of the first partition.

19 Claims, 10 Drawing Sheets

(56) References Cited

U.S. PATENT DOCUMENTS

2013/0168559 A1* 7/2013 Saruta .................. G01T 1/2006
                                                        250/366

FOREIGN PATENT DOCUMENTS

| | | | |
|---|---|---|---|
| JP | 2009141192 A | 6/2009 | |
| JP | 2010-067828 A | 3/2010 | |
| JP | 2011142234 A | 7/2011 | |
| JP | 2012-227474 A | 11/2012 | |
| JP | 2012-227476 A | 11/2012 | |
| JP | 2013-156463 A | 8/2013 | |
| JP | 2013-251292 A | 12/2013 | |
| JP | 2014-179577 A | 9/2014 | |
| JP | 2014-225667 A | 12/2014 | |
| JP | 2015-092521 A | 5/2015 | |
| TW | 200918961 A | 5/2009 | |
| TW | 200921865 A | 5/2009 | |
| TW | 200933882 A | 8/2009 | |
| TW | 200945569 A | 11/2009 | |
| TW | 201329529 A | 7/2013 | |
| TW | 201436180 A | 9/2014 | |
| TW | 201445716 A | 12/2014 | |
| TW | 201519422 A | 5/2015 | |

OTHER PUBLICATIONS

Japanese Office Action dated Dec. 14, 2015, as issued in corresponding Japan Patent Application No. 2014-194576 with English translation (8 pages).
Taiwnese Office Action dated Jan. 17, 2017 from corresponding Application No. 105103239; 4 pages.
Japanese Office Action dated Jan. 10, 2017 from corresponding Application No. 2016-013140; 5 pages.

\* cited by examiner

SOLID-STATE IMAGING DEVICES WITH ENHANCED ANGULAR RESPONSE

CROSS REFERENCE TO RELATED APPLICATIONS

This application is related to the following pending commonly assigned patent application: U.S. Ser. No. 14/267,480, filed on May 1, 2014 and entitled "Solid-state imaging devices", the entirety of which is incorporated by reference herein.

BACKGROUND

Field of the Invention

The invention relates to imaging devices, and more particularly to a partition grid of solid-state imaging devices.

Description of the Related Art

Solid-state image devices, such as charge-coupled device (CCD) image sensors and complementary metal-oxide semiconductor (CMOS) image sensors, have been widely used in various image-capturing apparatuses, such as digital still-image cameras, digital video cameras and the like. In solid-state imaging devices, multiple pixels are arrayed on a semiconductor substrate such as a silicon chip. Each pixel has a photoelectric transducer such as a photodiode, which generates a signal charge by performing photoelectric conversion of incident light received by the photodiode. Signal charges corresponding to photoelectrons generated in the photodiodes are obtained by a CCD-type or a CMOS-type reading circuit.

Solid-state imaging devices are roughly classified into two groups in terms of the direction of light incident on a light receiving unit. One is the front-side illuminated (FSI) imaging devices that receive light incident on the front side of a semiconductor substrate on which the wiring layer of the reading circuit is formed. The other is the back-side illuminated (BSI) imaging devices that receive light incident on the back side of a semiconductor substrate on which no wiring layer is formed. For imaging a color image, a color filter is provided in the FSI and BSI imaging devices. The FSI and BSI imaging devices usually have a light-shielding grid structure for blocking light between pixels to prevent color mixture. In FSI and BSI imaging devices, the light-shielding grid structure generally has uniform width and height at all locations of a pixel array of the imaging devices.

BRIEF SUMMARY

In solid-state imaging devices, an incident light radiates onto the edges of a pixel array at an oblique angle that is greater than a normal angle of the incident light radiating onto the center of the pixel array. The angles of the incident light are from the normal line of a light-receiving surface of the solid-state imaging devices. For example, an oblique angle of an incident light radiating onto the edges of the pixel array is about +/−20 degrees to about +/−40 degrees, and the normal angle of the incident light radiating onto the center of the pixel array is about 0 degrees. Therefore, photodiodes at the edges of the pixel array have sensitivities that are lower than the sensitivity of photodiodes at the center of the pixel array.

According to embodiments of the disclosure, various dimensional designs for a partition grid of solid-state imaging devices are provided to enhance the sensitivities of photodiodes at the edges of the pixel array. Moreover, the various dimensional designs for the partition grid of the solid-state imaging devices can achieve a uniform sensitivity of the photodiodes at the edges of the pixel array. Therefore, an enhancement in angular response (AR) of the solid-state imaging devices is also achieved. As a result, the photodiodes at the edges of the pixel array of the solid-state imaging devices have uniform quantum efficiency (QE). Thus, the performance of the pixels at the edges of the pixel array of the solid-state imaging devices is symmetric in color or other effects such as quantum efficiency (QE) and sensitivity.

In some embodiments, a solid-state imaging device is provided. The solid-state imaging device includes a substrate containing a plurality of photoelectric conversion elements that are arranged into a pixel array. The solid-state imaging device also includes a color filter layer containing a plurality of color filter segments disposed above the photoelectric conversion elements. The solid-state imaging device further includes a partition grid containing a plurality of partitions. Each of the partitions is disposed between two adjacent color filter segments. The color filter layer and the partition grid are disposed in the same layer. In addition, the partitions include a first partition disposed at a center line of the pixel array and a second partition disposed at an edge of the pixel array. The second partition has a top width that is larger than the top width of the first partition.

In some embodiments, a solid-state imaging device is provided. The solid-state imaging device includes a substrate containing a plurality of photoelectric conversion elements that are arranged into a pixel array. The solid-state imaging device also includes a color filter layer containing a plurality of color filter segments disposed above the photoelectric conversion elements. The solid-state imaging device further includes a partition grid containing a plurality of partitions. Each of the partitions surrounds one color filter segment. The color filter layer and the partition grid are disposed in the same layer. In addition, the color filter layer has a unit of multiple color filter segments. One color filter segment in the unit is surrounded by a first partition, and the other color filter segment in the unit is surrounded by a second partition. The first partition has a top width that is larger than the top width of the second partition.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION

The following description is of the contemplated mode of carrying out the disclosure. This description is made for the purpose of illustrating the general principles of the disclosure and should not be taken in a limiting sense. The scope of the disclosure is best determined by reference to the appended claims.

Figure 1:
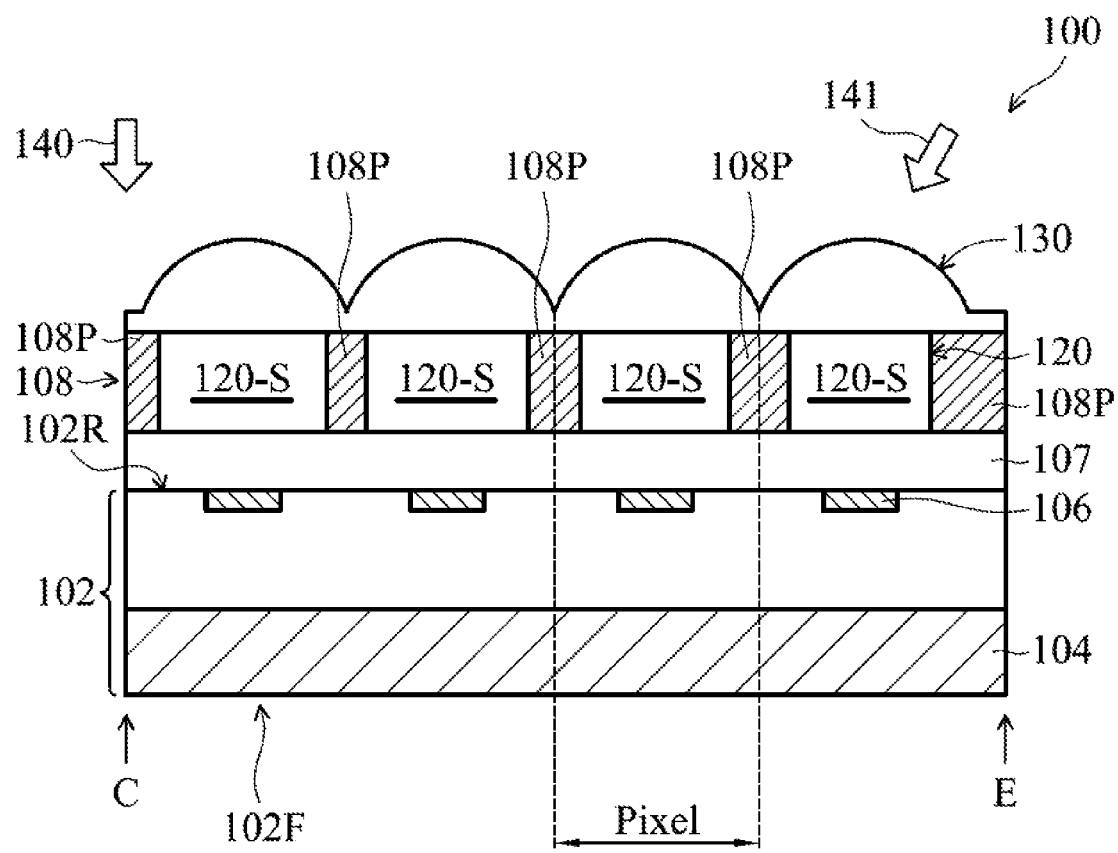
FIG. 1 shows a schematic partial cross section of a solid-state imaging device according to some embodiments of the disclosure.

Referring to FIG. 1, a cross section of a solid-state imaging device 100 according to some embodiments is shown. The solid-state imaging device 100 can be formed of a complementary metal-oxide semiconductor (CMOS) image sensor or a charge coupled device (CCD) image sensor. The solid-state imaging device 100 includes a substrate 102, for example, a semiconductor substrate having a front surface 102F and a rear surface 102R. The semiconductor substrate may be a wafer or a chip. The substrate 102 contains a plurality of photoelectric conversion elements 106, such as photodiodes formed therein and the photoelectric conversion elements 106 are arranged into a pixel array. The photoelectric conversion elements 106 are referred to as photodiodes 106 thereafter. Each of the photodiodes 106 is disposed in one respective pixel of the pixel array of the solid-state imaging device 100. The photodiodes 106 in the substrate 102 are isolated from each other. Although FIG. 1 shows four pixels, actually the solid-state imaging device 100 has several million or more pixels.

In some embodiments, the photodiodes 106 are formed on the rear surface 102R of the substrate 102. A wiring layer 104 including various wiring lines and electronic circuits required for the solid-state imaging device 100 is formed on the front surface 102F of the substrate 102. Incident lights 140 and 141 radiate onto the rear surface 102R of the substrate 102 and are received by the photodiodes 106. Therefore, the solid-state imaging device 100 as shown in FIG. 1 is referred to as a BSI imaging device. As shown in FIG. 1, in the BSI imaging device 100, the incident lights 140 and 141 radiate on the rear surface 102R of the substrate 102 to reach the photodiodes 106 without passing the wiring layer 104 formed on the front surface 102F of the substrate 102.

In some other embodiments, the solid-state imaging device can be a FSI imaging device. Incident light radiates onto the front surface of a substrate, passes through a wiring layer and then is received by photodiodes formed on the rear surface of the substrate. The path of incident light passing through an FSI imaging device to reach the photodiodes is farther than that of a BSI imaging device. Thus, the effects in angular response (AR) and quantum efficiency (QE) of an oblique incident light radiating onto the edges of a pixel array in a BSI imaging device are worse than in an FSI imaging device. According to embodiments of the disclosure, the enhancement in angular response (AR) and quantum efficiency (QE) of the BSI imaging device can be greater than those of the FSI imaging device.

Generally, the incident lights 140 and 141 radiate onto the center C and the edges E of the pixel array of the solid-state imaging devices 100 at different angles. The incident light 141 radiates onto the edges E of the pixel array of the solid-state imaging devices 100 at an oblique angle, for example about +/−20 degrees to about +/−40 degrees, from the normal line of the rear surface 102R of the substrate 102. The incident light 140 radiates onto the center C of the pixel array of the solid-state imaging devices 100 at a normal angle, for example about 0 degrees, from the normal line of the rear surface 102R of the substrate 102. A chief ray angle (CRA) of the incident light 141 radiating onto the edges E of the pixel array is greater than a CRA of the incident light 140 radiating onto the center C of the pixel array of the solid-state imaging device 100. Therefore, the photodiodes 106 at the edges E of the pixel array, which receive the oblique incident light 141 of a greater CRA, have a quantum efficiency (QE) and a sensitivity that are lower than the quantum efficiency (QE) and the sensitivity of the photodiodes 106 at the center C of the pixel array of the solid-state imaging device 100, which receive the normal incident light 140 of a smaller CRA.

According to some embodiments of the disclosure, as shown in FIG. 1, the solid-state imaging device 100 includes a partition grid 108 disposed over the rear surface 102R of the substrate 102. The partition grid 108 includes a plurality of partitions 108P. In some embodiments, the top widths and the bottom widths of the partitions 108P increase from the center C to the edge E of the pixel array. Although FIG. 1 shows five partitions, the partition grid 108 actually has more partitions arranged into multiple cross columns and rows as show in FIG. 2.

In some embodiments, the solid-state imaging device 100 includes a passivation layer 107 formed on the rear surface 102R of the substrate 102 and covering the photoelectric conversion elements 106. Moreover, the passivation layer 107 has a flat surface. The material of the passivation layer 107 includes silicon oxides, silicon nitrides, silicon oxynitrides or other suitable insulating materials.

As shown in FIG. 1, the solid-state imaging devices 100 further include a color filter layer 120 formed on the flat surface of the passivation layer 107. The color filter layer 120 includes a plurality of color filter segments 120-S disposed above the photoelectric conversion elements 106. Each color filter segment 120-S corresponds to one respective photoelectric conversion element 106. Although FIG. 1 shows four color filter segments, actually the filter layer 120 contains more color filter segments. In some embodiments, the color filter segments 120-S are a three-primary-color of red (R), green (G) and blue (B) color filter segments arrayed by a suitable arrangement. In some other embodiments, the color filter segments 120-S includes white (W) color filter segments arrayed with R, G and B color filter segments together in a suitable arrangement.

In some embodiments, the filter layer 120 and the partition grid 108 are disposed in the same layer above the passivation layer 107. In some embodiments, each of the partitions of the partition grid 108, except the partitions at the edges of the pixel array, is disposed between two adjacent color filter segments. For example, each of the partitions 108P is disposed between two adjacent color filter segments 120-S.

In some embodiments, the partition grid can be formed by a deposition, photolithography, and etching process or by a printing process.

In addition, as shown in FIG. 1, the solid-state imaging devices 100 also include a microlens structure 130 disposed on a coplanar surface of the color filter layer 120 and the partition grid 108. The microlens structure 130 has a plurality of microlens elements arranged into an array. The microlens structure 130 is provided to efficiently radiate an incident light onto the photodiodes 106. In some embodiments, a chemical vapor deposition (CVD) oxide thin-film (not shown) is further deposited on the surface of the microlens structure 130. The material of the CVD thin film includes silicon oxide, silicon nitride or a combination thereof.

Figure 2:
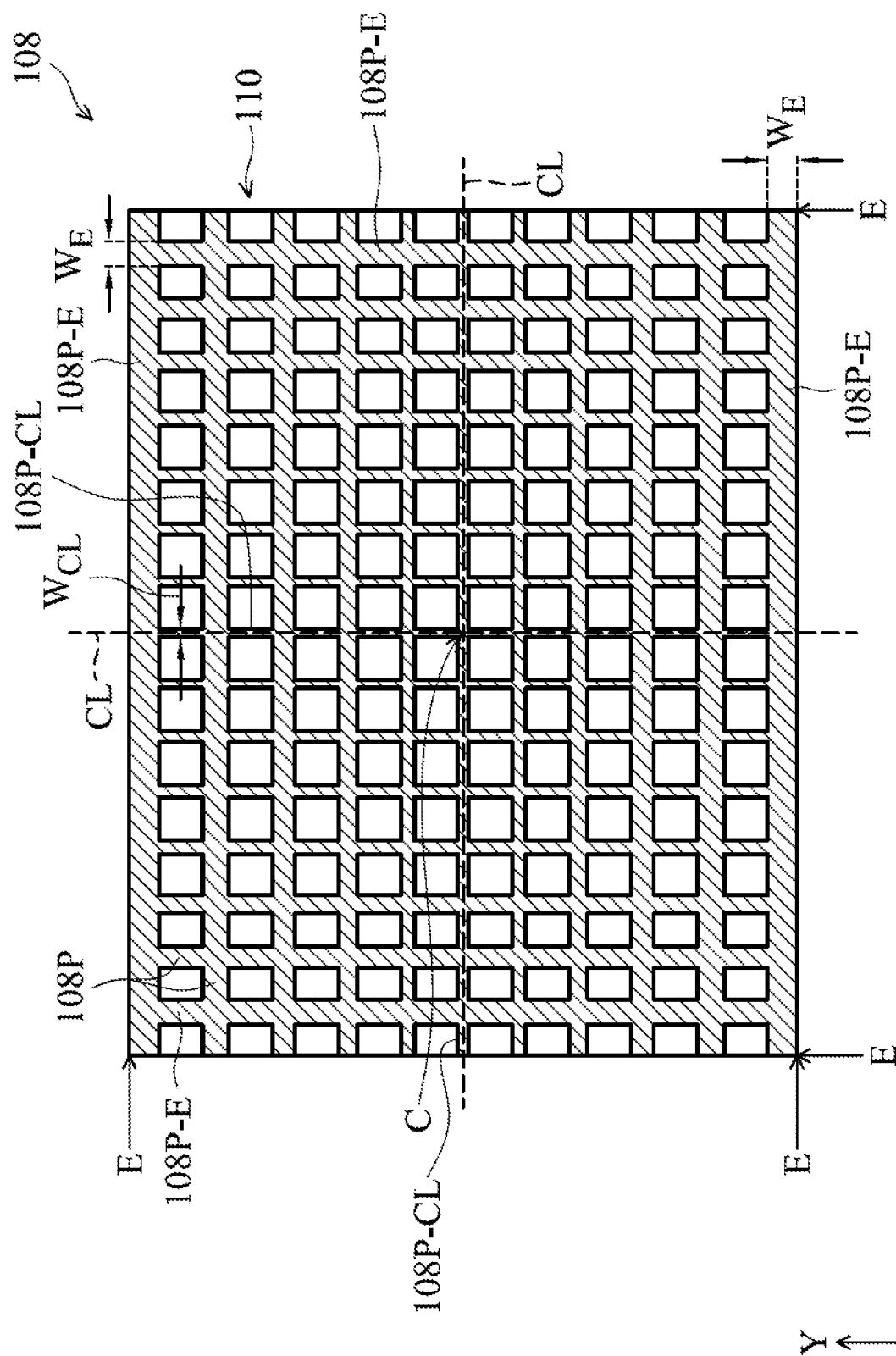
FIG. 2 shows a schematic plane view of a partition grid of a solid-state imaging device according to some embodiments of the disclosure.

Referring to FIG. 2, a plane view of a partition grid 108 of a solid-state imaging device 100 according to some embodiments is shown. The partition grid 108 includes a plurality of partitions 108P having different dimensions in top width from a center line CL to an edge E of the pixel array 110. A first partition 108P-CL disposed at the center line CL of the pixel array 110 has a top width $W_{CL}$. A second partition 108P-E disposed at the edge E of the pixel array 110 has a top width $W_E$ that is larger than the top width $W_{CL}$ of the first partition 108P-CL. In some embodiments, the partition grid 108 is made of a light-transmitting material. Thus, an incident light radiating onto the solid-state imaging device 100 can pass through the partitions 108P of the partition grid 108. In addition, the partition grid 108 has a refractive index that is lower than the refractive index of the color filter layer 120. Thus, there is a total reflection occurring at the interface between the partition 108P and the color filter segment 120-S. In some embodiments, the material of the partition grid 108 is a low refractive index (n) material such as silicon oxide or an organic photo-resist.

According to the embodiments, the second partition 108P-E at the edge E of the pixel array 110 with a larger top width $W_E$ can allow greater amount of incident light to pass through and transmit to the photodiodes 106 at the edges E of the pixel array 110 of the solid-state imaging device 100. Therefore, the second partition 108P-E at the edge E of the pixel array 110 with a larger top width $W_E$ can enhance the quantum efficiency (QE) and the sensitivity of the photodiodes 106 at the edges E of the pixel array 110 of the solid-state imaging device 100 while receiving an oblique incident light 141 as shown in FIG. 1. Thus, the dimensions of the partition grid 108 according to the embodiments can improve the chip edge response of the solid-state imaging device 100. Moreover, angular response (AR) of the solid-state imaging device 100 is also improved by the dimensions of the partition grid 108 according to the embodiments and uniform performance at the edges of the pixel array is thereby achieved.

Figure 3A:
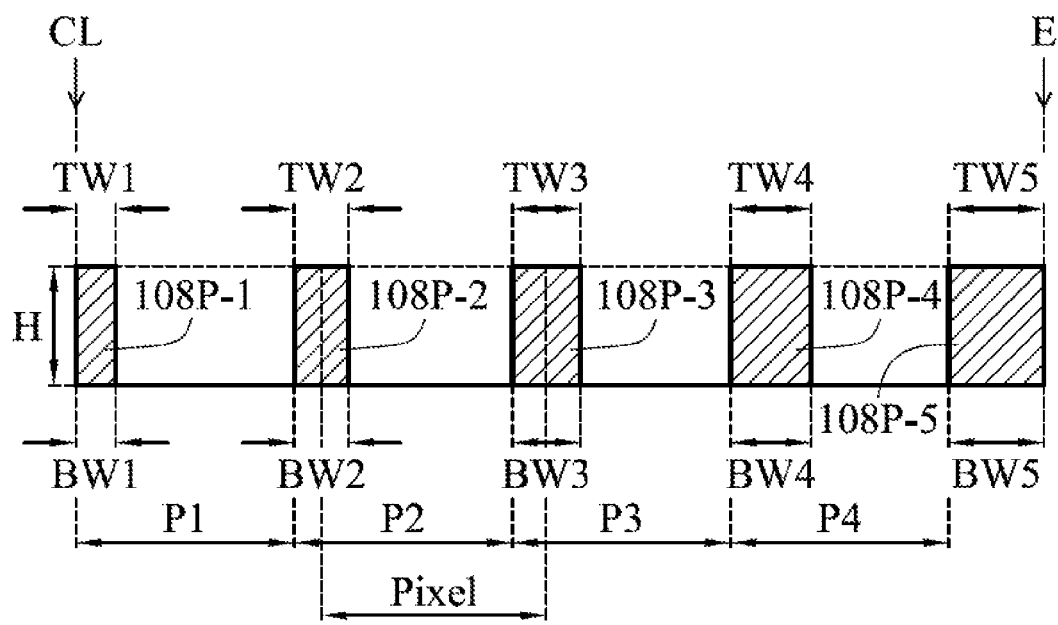
FIGS. 3A-3F show schematic cross sections of multiple partitions of various partition grids of solid-state imaging devices according to some embodiments of the disclosure, from a center line CL to an edge E of a pixel array along an X-axial direction and along a Y-axial direction shown in FIG. 2.

Referring to FIG. 3A, a cross section of multiple partitions 108P-1 to 108P-5 of a partition grid 108 of a solid-state imaging device 100, from a center line CL to an edge E of the pixel array, along an X-axial direction and a Y-axial direction shown in FIG. 2, according to some embodiments of the disclosure is shown. In the embodiments, each of the partitions 108P-1 to 108P-5 of the partition grid 108 has a top width TW1 to TW5 that is the same as a bottom width BW1 to BW5 thereof. For example, TW1=BW1, TW2=BW2, TW3=BW3, TW4=BW4, and TW5=BW5. All partitions of the partition grid 108 have vertical sidewalls. Moreover, all the partitions of the partition grid 108 have the same height H.

In addition, the partitions 108P-1 to 108P-5 from the center line CL to the edge E of the pixel array have the top widths TW1 to TW5 that are different from one another. Furthermore, the top widths TW1 to TW5 of the partitions 108P-1 to 108P-5 gradually increase from the center line CL to the edge E of the pixel array of the solid-state imaging device 100. The partitions 108P-5 at the edges E of the partition grid 108 having a larger top width TW5 than the top widths TW1 to TW4 of the other partitions 108P-1 to 108P-4 of the partition grid 108 can enhance the sensitivity of the pixels at the edges of the pixel array of the solid-state imaging device 100.

Furthermore, in some embodiments, pitches of all partitions of the partition grid 108, for example the pitches P1, P2, P3 and P4 of the partitions 108P-1 to 108P-5, along the X-axial direction and along a Y-axial direction shown in FIG. 2 are equal. All partitions of the partition grid 108 are arranged with the same pitch in the solid-state imaging device 100. Each pixel of the pixel array includes the areas of one color filter segment and one partition. All pixels of the pixel array are the same size. Moreover, in some embodiments, all color filter segments of the color filter layer are the same size. In some other embodiments, all color filter segments of the color filter layer are different sizes.

In some other embodiments, the pitches of all partitions of the partition grid 108, for example pitches P1, P2, P3 and P4 of the partitions 108P-1 to 108P-5, along the X-axial direction and along the Y-axial direction shown in FIG. 2 are different from each other. The partitions of the partition grid 108 along the X-axial direction and along the Y-axial direction are arranged with gradually increased pitches or gradually decreased pitches from the center line CL to the edge E of the pixel array in the solid-state imaging device 100. The pixels of the pixel array are different sizes. Moreover, in some embodiments, all color filter segments of the color filter layer are the same size. In some other embodiments, all the color filter segments of the color filter layer are different sizes.

Figure 3B:
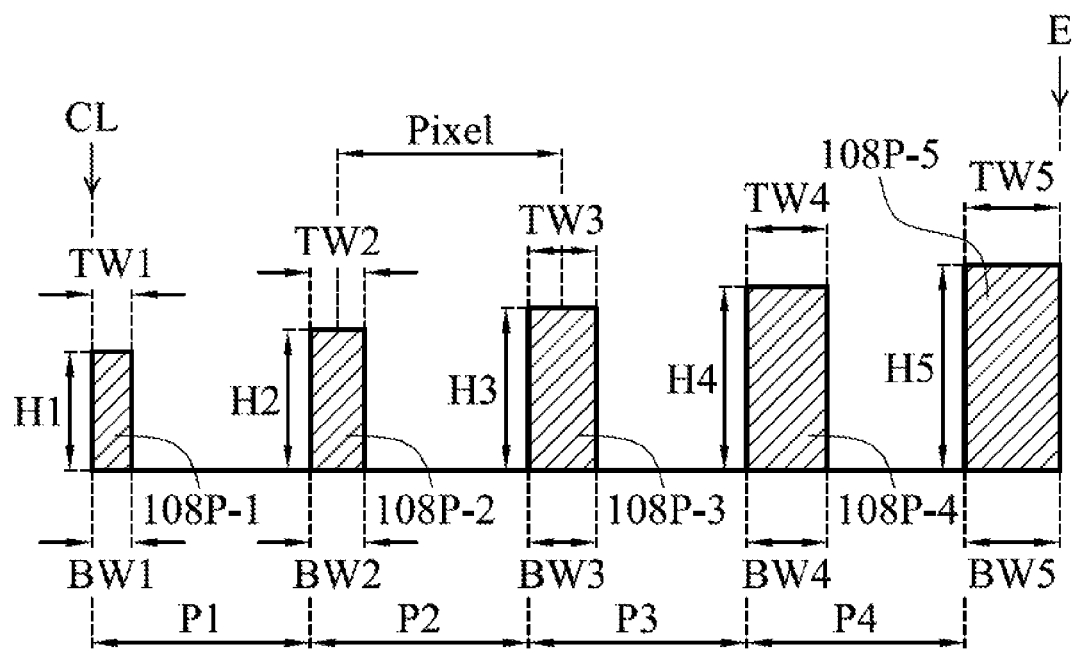

Referring to FIG. 3B, a cross section of multiple partitions 108P-1 to 108P-5 of a partition grid 108 of a solid-state imaging device 100, from a center line CL to an edge E of the pixel array, along an X-axial direction and along a Y-axial direction shown in FIG. 2, according to some embodiments is shown. In the embodiments, partitions 108P-1 to 108P-5 of the partition grid 108 from the center line CL to the edge E of the pixel array have heights H1 to H5 that are different from one another. In some embodiments, the heights H1 to H5 of the partitions 108P-1 to 108P-5 gradually increase from the center line CL to the edge E of the pixel array. The other conditions in top widths, bottom widths, pitches and materials of the partitions 108P-1 to 108P-5 of the partition grid 108 in the embodiments of FIG. 3B, except the heights H1 to H5, can be the same as those of FIG. 3A. Moreover, the condition in pixel size of the pixel array in the embodiments of FIG. 3B can be the same as that of FIG. 3A.

In the embodiments of FIG. 3B, the partitions 108P-5 of the partition grid 108 at the edges E of the pixel array having a larger top width TW5 and a higher height H5 than those of the other partitions 108P-1 to 108P-4 of the partition grid 108. Therefore, the dimensions in top width and height of the partitions of the partition grid 108 can enhance the sensitivity of the pixels at the edges E of the pixel array in the solid-state imaging device 100.

Figure 3C:
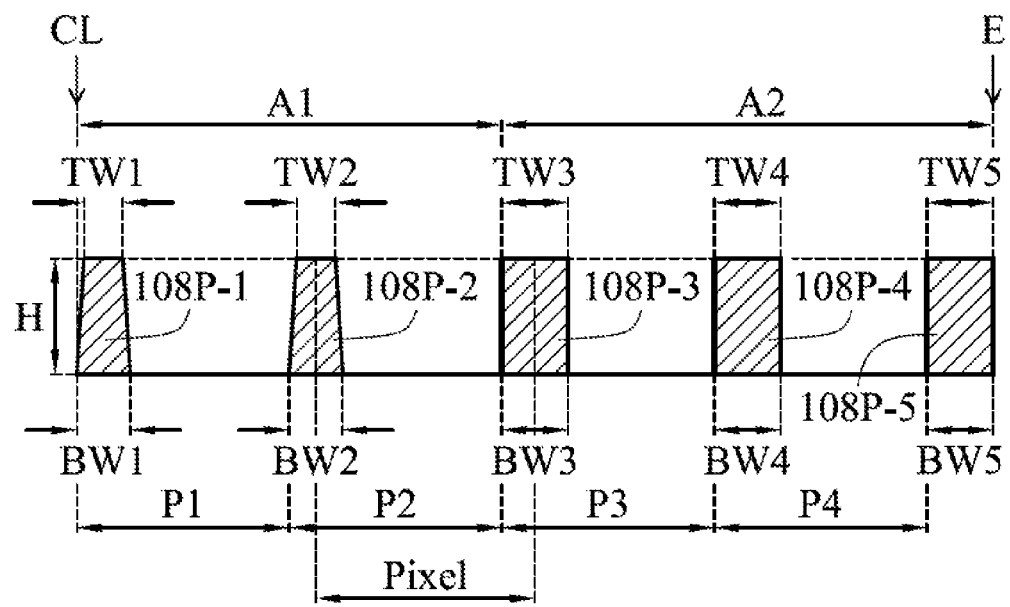

Referring to FIG. 3C, a cross section of multiple partitions 108P-1 to 108P-5 of a partition grid 108 of a solid-state imaging device 100, from a center line CL to an edge E of the pixel array, along an X-axial direction and along a Y-axial direction shown in FIG. 2, according to some embodiments is shown. In the embodiments, the partitions 108P-1 to 108P-2 of the partition grid 108 disposed in a first area A1 of the pixel array have a top width TW1 to TW2 that is smaller than the bottom width BW1 to BW2 thereof. For example, the partition 108P-1 has the top width TW1 smaller than the bottom width BW1, and the partition 108P-2 has the top width TW2 smaller than the bottom width BW2.

The partitions 108P-3 to 108P-5 of the partition grid 108 disposed in a second area A2 of the pixel array have a top width TW3 to TW5 that is the same as the bottom width BW3 to BW5 thereof. For example, TW3=BW3, TW4=BW4 and TW5=BW5.

In some embodiments, the first area A1 is defined by an area irradiated by an incident light at an angle of 0 to +/−20 degrees. The second area A2 is defined by an area irradiated by an incident light at an angle of greater than +/−20 degrees. In the embodiments, the top widths TW3 to TW5 of the partitions 108P-3 to 108P-5 in the second area A2 are larger than the top widths TW1 to TW2 of the partitions 108P-1 to 108P-2 in the first area A1. Moreover, all the partitions 108P-1 to 108P-5 of the partition grid 108 have the same height H.

As shown in FIG. 3C, each of the partitions 108P-1 to 108P-2 in the first area A1 has a tapered cross-section and slanted sidewalls. Each of the partitions 108P-3 to 108P-5 in the second area A2 has a rectangle cross-section and vertical sidewalls. The partitions 108P-3 to 108P-5 in the second area A2 with the vertical sidewalls produce an angle of total reflection that is greater than that produced by the slanted sidewalls of the partitions 108P-1 to 108P-2 in the first area A1. Moreover, the partitions 108P-3 to 108P-5 of the partition grid 108 in the second area A2 have larger top widths TW3 to TW5 than the top widths TW1 to TW2 of the partitions 108P-1 to 108P-2 in the first area A1. Thus, the partitions of the partition grid 108 in the second area A2 which irradiated by an incident light at an angle of greater than +/−20 degrees can enhance the sensitivity of the pixels in the second area A2 including the edges E of the pixel array of the solid-state imaging device 100.

In some embodiments, the partitions in the first area A1 have the same top width TW1 to TW2 and the same bottom width BW1 to BW2. For example, TW1=TW2, and BW1=BW2. Moreover, the partitions in the second area A2 have the same top width TW3 to TW5 and the same bottom width BW3 to BW5. For example, TW3=TW4=TW5, and BW3=BW4=BW5.

In some other embodiments, the partitions 108P-1 to 108P-2 disposed in the first area A1 of the pixel array have top widths TW1 to TW2 that are different from one another. Moreover, the partition 108P-1 has the bottom width BW1 that is different from the bottom width BW2 of the partition 108P-2. The partitions 108P-3 to 108P-5 disposed in the second area A2 of the pixel array have top widths TW3 to TW5 that are different from one another. Moreover, the partitions 108P-3 to 108P-5 disposed in the second area A2 of the pixel array have bottom widths BW3 to BW5 that are different from one another. For example, TW3≠TW4≠TW5, and BW3≠BW4≠BW5. In some embodiments, the top widths TW1 to TW2 of the partitions 108P-1 to 108P-2 in the first area A1 gradually increase along a direction from the center line CL to the edge E of the pixel array. The top widths TW3 to TW5 of the partitions 108P-3 to 108P-5 in the second area A2 gradually increase along a direction from the center line CL to the edge E of the pixel array.

Furthermore, in some embodiments, pitches of all partitions of the partition grid 108, for example the pitches P1, P2, P3 and P4 of the partitions 108P-1 to 108P-5, along the X-axial direction and along the Y-axial direction shown in FIG. 2 are equal. Moreover, all pixels of the pixel array are the same size.

In some other embodiments, the pitches of all partitions of the partition grid 108, for example the pitches P1, P2, P3 and P4 of the partitions 108P-1 to 108P-5, along the X-axial direction and along the Y-axial direction shown in FIG. 2 are different from one another. The partitions of the partition grid 108 along the X-axial direction and along the Y-axial direction can be arranged with gradually increased pitches or gradually decreased pitches from the center line CL to the edge E of the pixel array. Moreover, the pixels of the pixel array are all different sizes.

Figure 3D:
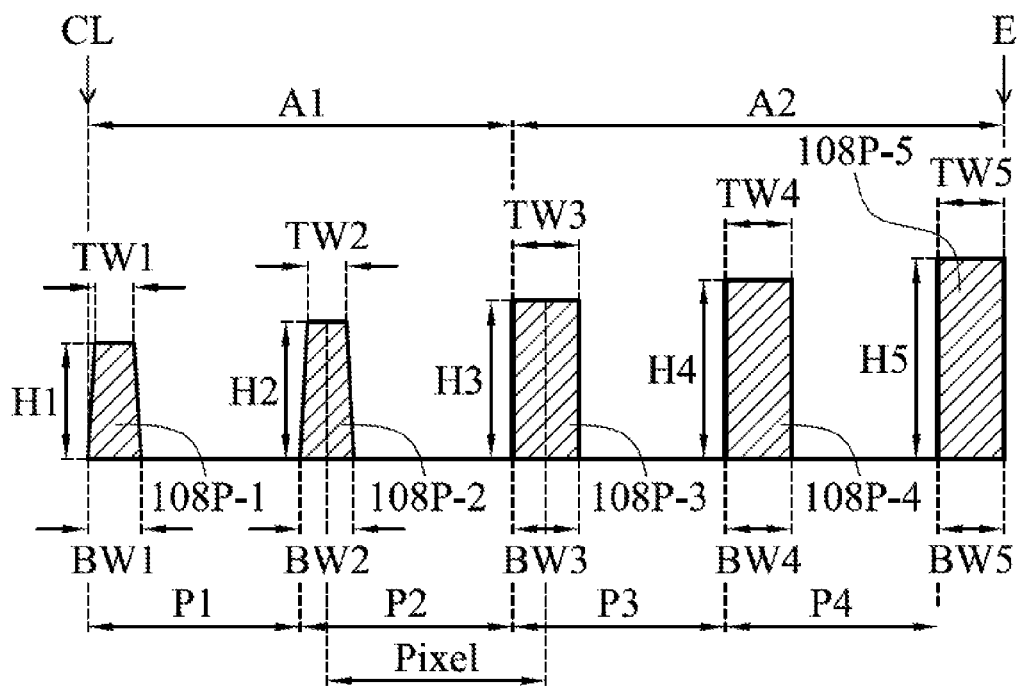

Referring to FIG. 3D, a cross section of multiple partitions 108P-1 to 108P-5 of a partition grid 108 of a solid-state imaging device 100, from a center line CL to an edge E of the pixel array, along an X-axial direction and along a Y-axial direction shown in FIG. 2, according to some embodiments of the disclosure is shown. In the embodiments, partitions 108P-1 to 108P-5 of the partition grid 108 from the center line CL to the edge E of the pixel array have heights H1 to H5 that are different from one another. In some embodiments, the heights H1 to H5 of the partitions 108P-1 to 108P-5 gradually increase from the center line CL to the edge E of the pixel array. The other conditions in top widths, bottom widths, pitches and materials of the partitions 108P-1 to 108P-5 in the embodiments of FIG. 3D can be the same as those of FIG. 3C. Moreover, the condition in pixel size of the pixel array in the embodiments of FIG. 3D can be the same as that of FIG. 3C.

In the embodiments of FIG. 3D, the partition 108P-5 of the partition grid 108 at the edge E of the pixel array having a larger top width TW5 and a higher height H5 than the top widths TW1 to TW4 and the heights H1 to H4 of the other partitions 108P-1 to 108P-4 at other areas of the pixel array. Thus, the dimensions of the partitions of the partition grid 108 at the edges E of the pixel array can enhance the sensitivity of the pixels at the edges E of the pixel array of the solid-state imaging device 100.

Figure 3E:
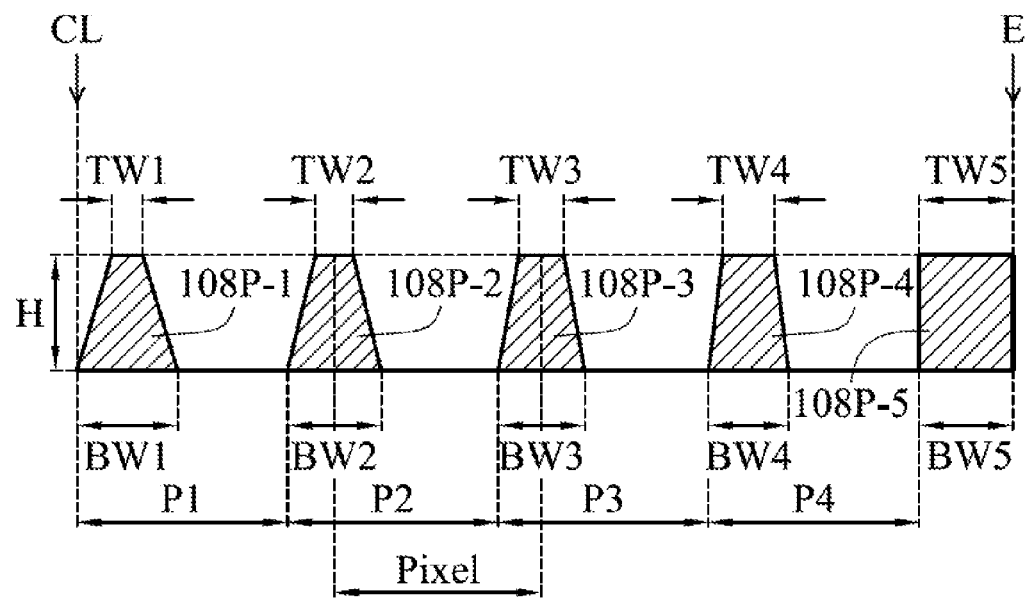

Referring to FIG. 3E, a cross section of multiple partitions 108P-1 to 108P-5 of a partition grid 108 of a solid-state imaging device 100, from a center line CL to an edge E of the pixel array, along an X-axial direction and along a Y-axial direction shown in FIG. 2, according to some embodiments of the disclosure is shown. In the embodiments, the partitions 108P-1 to 108P-5 of the partition grid 108 from the center line CL to the edge E of the pixel array have top widths TW1 to TW5 that are different from one another. Moreover, the partitions 108P-1 to 108P-5 of the partition grid 108 from the center line CL to the edge E of the pixel array have bottom widths BW1 to BW5 that also are different from one another.

The top widths TW1 to TW5 of the partitions 108P-1 to 108P-5 gradually increase from the center line CL to the edge E of the pixel array. The bottom widths BW1 to BW5 of the partitions 108P-1 to 108P-5 gradually decrease from the center line CL to the edge E of the pixel array. In addition, the top widths TW1 to TW4 of the partitions 108P-1 to 108P-4 are smaller than the bottom widths BW1 to BW4 thereof. The top width TW5 of the partition 108P-5 at the edge E of the pixel array is equal to the bottom width BW5 thereof.

In the embodiments, each of the partitions 108P-1 to 108P-5 has a ratio of the top width to the bottom width. The ratios of the top width to the bottom width of the partitions 108P-1 to 108P-5 gradually increase form the center line CL to the edge E of the pixel array. Moreover, the ratio of the top width to the bottom width of the partition 108P-5 at the edge E of the pixel array is equal to 1. The ratios of the top width to the bottom width of the partitions 108P-1 to 108P-4 at the other areas of the pixel array is smaller than 1. In addition, all the partitions the partition grid 108 have the same height H. For example, the partitions 108P-1 to 108P-5 have the same height H.

Furthermore, in some embodiments, pitches of all partitions of the partition grid 108, for example the pitches P1, P2, P3 and P4 of the partitions 108P-1 to 108P-5, along the X-axial direction and along the Y-axial direction shown in FIG. 2 are equal. Moreover, all pixels of the pixel array are the same size.

In some other embodiments, the pitches of all partitions of the partition grid 108, for example the pitches P1, P2, P3 and P4 of the partitions 108P-1 to 108P-5, along the X-axial direction and along the Y-axial direction shown in FIG. 2 are different from one another. The partitions of the partition grid 108 along the X-axial direction and along the Y-axial direction can be arranged with gradually increased pitches or gradually decreased pitches from the center line CL to the edge E of the pixel array. Moreover, the pixels of the pixel array are all different sizes.

As shown in FIG. 3E, each of the partitions 108P-1 to 108P-4 that is not disposed at the edge E of the pixel array has a tapered cross-section and slanted sidewalls. The partition 108P-5 disposed at the edge E of the pixel array has rectangle cross-section and vertical sidewalls. The partition 108P-5 at the edge E of the pixel array having vertical sidewalls produces a total reflection effect that is better than the total reflection effect produced by the slanted sidewalls of the partitions 108P-1 to 108P-4. Moreover, the partition 108P-5 of the partition grid 108 at the edge E of the pixel array has a larger top width TW5 than the top widths of the partitions 108P-1 to 108P-4. Therefore, the dimensional design and the cross-sectional shape of the partitions of the partition grid 108 at the edge E of the pixel array can improve the quantum efficiency (QE) and the sensitivity of the pixels at the edges E of the pixel array of the solid-state imaging device 100 while receiving an oblique incident light.

Figure 3F:
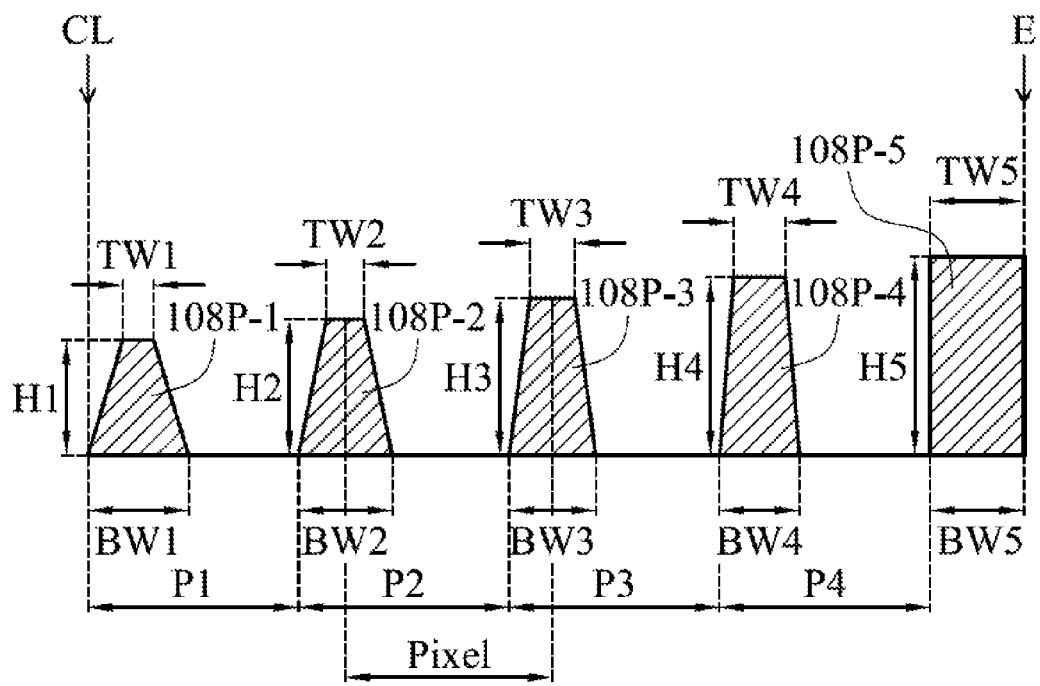

Referring to FIG. 3F, a cross section of multiple partitions 108P-1 to 108P-5 of a partition grid 108 of a solid-state imaging device 100, from a center line CL to an edge E of the pixel array, along an X-axial direction and along a Y-axial direction shown in FIG. 2, according to some embodiments of the disclosure is shown. In the embodiments, the partitions 108P-1 to 108P-5 of the partition grid 108 from the center line CL to the edge E of the pixel array have heights H1 to H5 that are different from one another. In some embodiments, the heights H1 to H5 of the partitions 108P-1 to 108P-5 gradually increase from the center line CL to the edge E of the pixel array. The conditions in top widths, bottom widths, pitches and materials of the partitions 108P-1 to 108P-5 of the partition grid 108 in the embodiments of FIG. 3F can be the same as those of FIG. 3E. Moreover, the condition in pixel size of the pixel array in the embodiments of FIG. 3F can be the same as that of FIG. 3E.

In the embodiments of FIG. 3F, the partition 108P-5 of the partition grid 108 at the edge E of the pixel array has a larger top width TW5 and a higher height H5 than the top widths TW1 to TW4 and the heights H1 to H4 of the other partitions partitions 108P-1 to 108P-4. Thus, the dimensional design of the partitions of the partition grid 108 can enhance the sensitivity and the quantum efficiency (QE) of the pixels at the edges E of the pixel array of the solid-state imaging device 100.

Figure 4A:
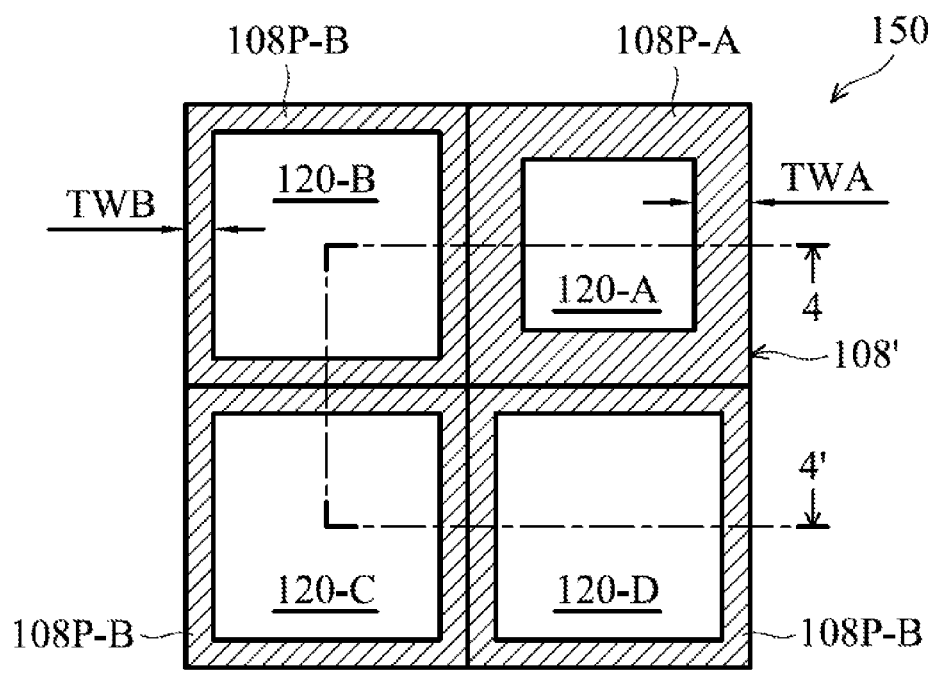
FIG. 4A shows a schematic plane view of a unit of multiple color filter segments of a color filter layer surrounded by a partial partition grid in a solid-state imaging device according to some embodiments of the disclosure.

Referring to FIG. 4A, a plane view of a unit 150 containing multiple color filter segments 120-A to 120-D surrounded by a partial partition grid 108' of a solid-state imaging device 100 according to some embodiments is shown. The unit 150 shown in FIG. 4A can be a repeat unit of the color filter layer 120 and the partition grid 108 of FIG. 1. In the embodiments, other elements of the solid-state imaging device 100 can be the same as those of the solid-state imaging device 100 shown in FIG. 1, and not described again to simplify the specification.

As shown in FIG. 4A, each of the partitions 108P-A to 108P-B of the partial partition grid 108' surrounds one of color filter segments 120-A to 120-D, respectively. One pixel of the pixel array contains one color filter segment and one partition. In the embodiments, the color filter layer 120 and the partition grid 108 are disposed in the same layer of the solid-state imaging device 100 as shown in FIG. 1. In other words, the color filter segments 120-A to 120-D and the partitions 108P-A to 108P-B of the partial partition grid 108' are disposed in the same layer of the solid-state imaging device. Moreover, the partition grid 108 has a refractive index that is lower than the refractive index of the color filter layer 120. In other words, the partitions 108P-A to 108P-B have a refractive index that is lower than the refractive indexes of the color filter segments 120-A to 120-D.

In some embodiments, one color filter segment 120-A in the unit 150 is surrounded by a first partition 108P-A which has a top width WA. Each of the other color filter segments 120-B to 120-D in the unit 150 is surrounded by a second partition 108P-B which has a top width WB. In the embodiments, the top width WA of the first partition 108P-A is larger than the top width WB of the second partition 108P-B.

In some embodiments, the color filter segment 120-A surrounded by the first partition 108P-A has a color that is different from the colors of the other color filter segments 120-B to 120-D surrounded by the second partition 108P-B. For example, the color filter segment 120-A has red color, and the other color filter segments 120-B to 120-D have green color and blue color. The first partition 108P-A surrounding the color filter segment 120-A has a larger top width WA than the top width WB of the second partition 108P-B surrounding the other color filter segments 120-B to 120-D. Therefore, the sensitivity and the quantum efficiency (QE) of the pixel of the solid-state imaging device 100 having the first partition 108P-A are enhanced due to the larger top width WA.

Figure 4B:
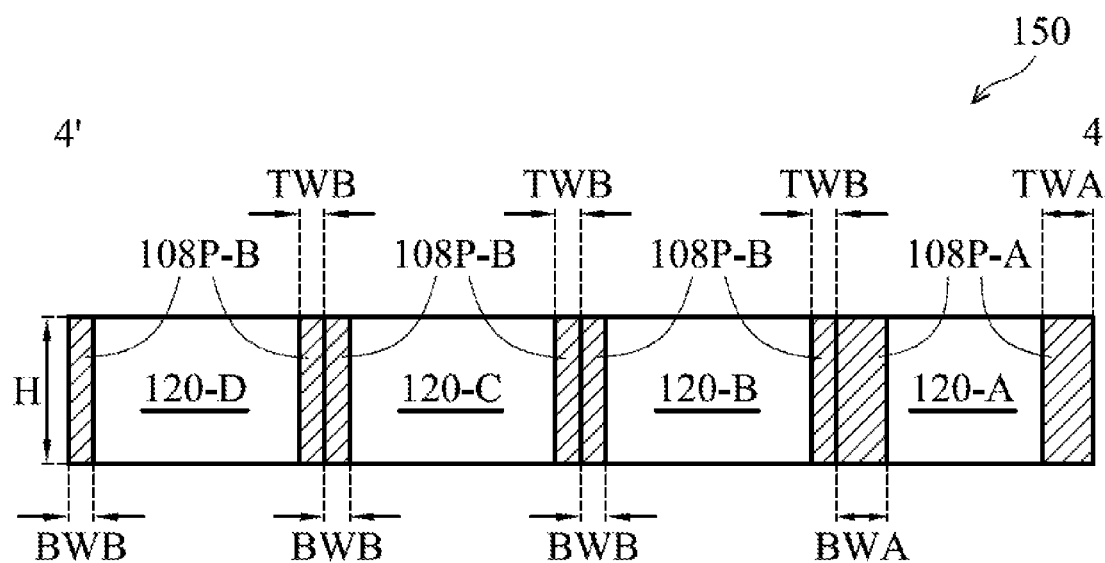
FIGS. 4B-4C show schematic cross sections of a unit of multiple color filter segments surrounding by various partition grids of solid-state imaging devices, along a cross-sectional line 4-4' of FIG. 4, according to some embodiments of the disclosure.

FIG. 4B is a cross section of the unit 150 containing multiple color filter segments 120-A to 120-D surrounded by the partial partition grid 108', along the cross-sectional line 4-4' shown in FIG. 4, according to some embodiments of the disclosure. In the embodiments, the first partition 108P-A has a ratio of the top width TWA to the bottom width BWA that is equal to 1. The second partition 108P-B has a ratio of the top width TWB to the bottom width BWB that also is equal to 1. Thus, the first partition 108P-A and the second partition 108P-B have rectangle cross-section and vertical sidewalls.

In addition, the top width TWA and the bottom width BWA of the first partition 108P-A are larger than the top width TWB and the bottom width BWB of the second partition 108P-B. Moreover, in some embodiments, the first partition 108P-A and the second partition 108P-B have the same height H. In the embodiments, the second partitions 108P-B surrounding the color filter segments 120-B to 120-D have the same top width TWB and the same bottom width BWB. In some other embodiments, the second partitions 108P-B surrounding the color filter segments 120-B to 120-D can have different top widths and different bottom widths from one another.

Figure 4C:
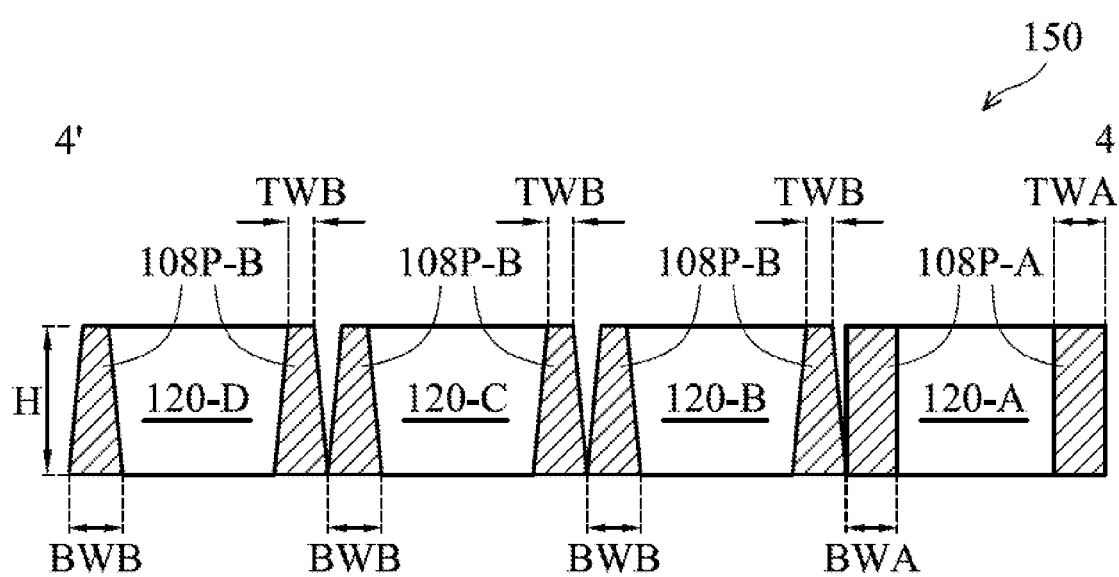

FIG. 4C is a cross section of the unit 150 containing multiple color filter segments 120-A to 120-D surrounded by the partial partition grid 108' of a solid-state imaging device 100, along the cross-sectional line 4-4' shown in FIG. 4, according to some embodiments of the disclosure. In the embodiments, the first partition 108P-A has a ratio of the top width TWA to the bottom width BWA that is equal to 1. The second partition 108P-B has a ratio of the top width TWB to the bottom width BWB that is smaller than 1. The first partition 108P-A has a rectangle cross-section and vertical sidewalls. The second partition 108P-B has a tapered cross-section and slanted sidewalls.

Moreover, the top width TWA of the first partition 108P-A is larger than the top width TWB of the second partition 108P-B. The bottom width BWA of the first partition 108P-A may be equal to or smaller than the bottom width BWB of the second partition 108P-B. In some embodiments, the first partition 108P-A and the second partition 108P-B have the same height H. In some other embodiments, the first partition 108P-A and the second partition 108P-B have different heights. In the embodiments, the second partitions 108P-B surrounding the color filter segments 120-B to 120-D have the same top width and the same bottom width. In some other embodiments, the second partitions 108P-B surrounding the color filter segments 120-B to 120-D can have different top widths and different bottom widths from one another.

In the embodiments of FIG. 4C, the first partition 108P-A surrounding the color filter segment 120-A has a larger top width WA than the top width WB of the second partition 108P-B surrounding the color filter segments 120-B to 120-D. Moreover, the first partition 108P-A having vertical sidewalls which produces a total reflection effect that is better than the total reflection effect produced from the slanted sidewalls of the second partition 108P-B. Therefore, the sensitivity and the quantum efficiency (QE) of the pixels of the solid-state imaging device 100 having the first partition 108P-A are enhanced due to the larger top width TWA and the vertical sidewalls of the first partition 108P-A.

In some embodiments, the sensitivity and the quantum efficiency (QE) of the pixels of red color and blue color can be adjusted to be consistent with those of the pixels of green color in the solid-state imaging device 100 by a dimensional design of the partitions in the red, blue and green pixels. In some embodiments, the sensitivity and the quantum efficiency (QE) of the pixels in a certain area of the solid-state imaging device 100 can be adjusted to be higher than those of the pixels in the other area of the solid-state imaging device 100 by a dimensional design of the partitions in the certain area. The certain area of the solid-state imaging device 100 is depended on the requirements of products.

In the embodiments of FIGS. 4A-4C, each pixel of the pixel array includes one color filter segment and one partition. In some embodiments, all pixels of the pixel array are the same size. In some other embodiments, the pixels of the pixel array are different sizes. For example, the pixels corresponding to the color filter segments 120-A to 120-D can have four different sizes.

Figure 5:
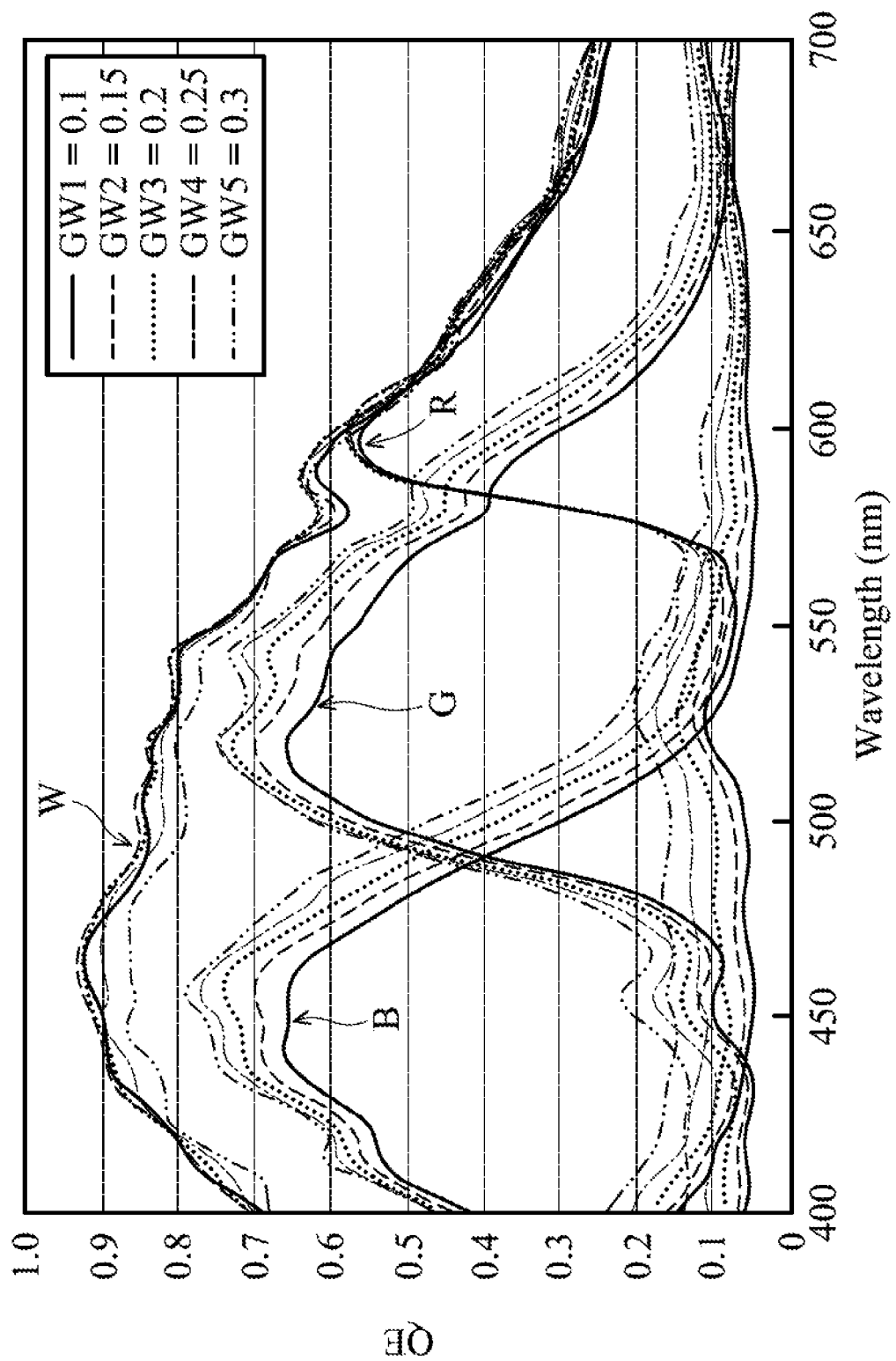
FIG. 5 shows a graph of QE vs. wavelength curves for R, G, B, and W pixels of solid-state imaging devices with various top widths of partitions according to some embodiments of the disclosure.

FIG. 5 is a graph of QE vs. wavelength curves of R, G, B, and W pixels of solid-state imaging devices with various top widths GW1 to GW5 of partitions, such as GW1=0.1 nm, GW2=0.15 nm, GW3=0.2 nm, GW4=0.25 nm, and GW5=0.3 nm, according to some embodiments. As the results show in FIG. 5, the R, G, B, and W pixels with larger top widths such as GW2 to GW5 of partitions have higher QE values. Therefore, the larger top width of the partitions can enhance the QE of the pixels of the solid-state imaging devices.

Figure 6A:
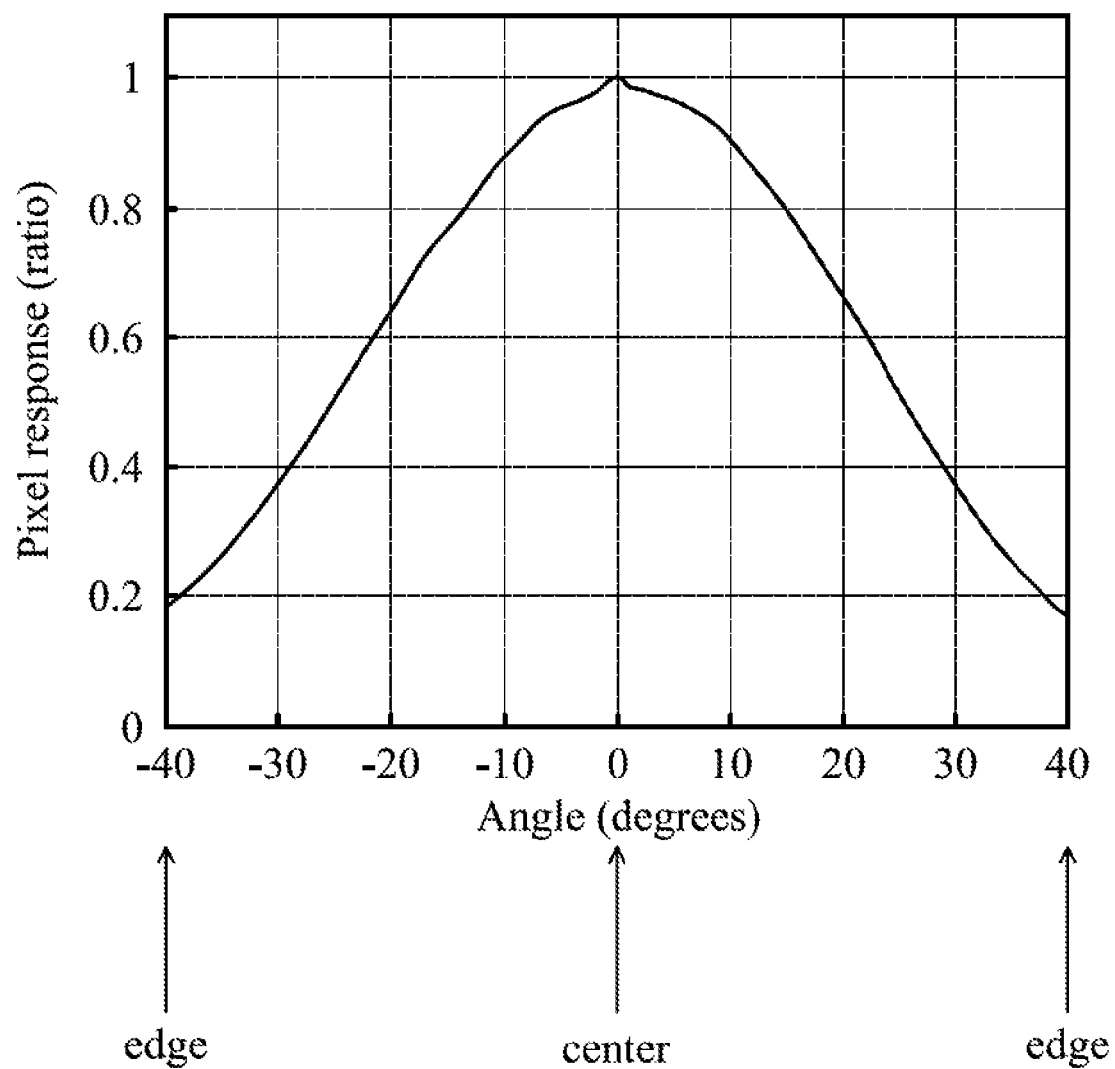
FIG. 6A shows a graph of pixel response vs. angle of an incident light radiating onto a solid-state imaging device curve without a dimensional design of a partition grid of the disclosure.

FIG. 6A shows a graph of pixel response vs. angle of incident light curve without a dimensional design of a partition grid of the disclosure. As shown in FIG. 6A, the pixel response is equal to 1 at the center of a pixel array irradiated by a normal incident light with an angle of 0 degrees. The pixel response is lower than 0.2 at the edges of the pixel array irradiated by an oblique incident light with an angle of +/−40 degrees.

Figure 6B:
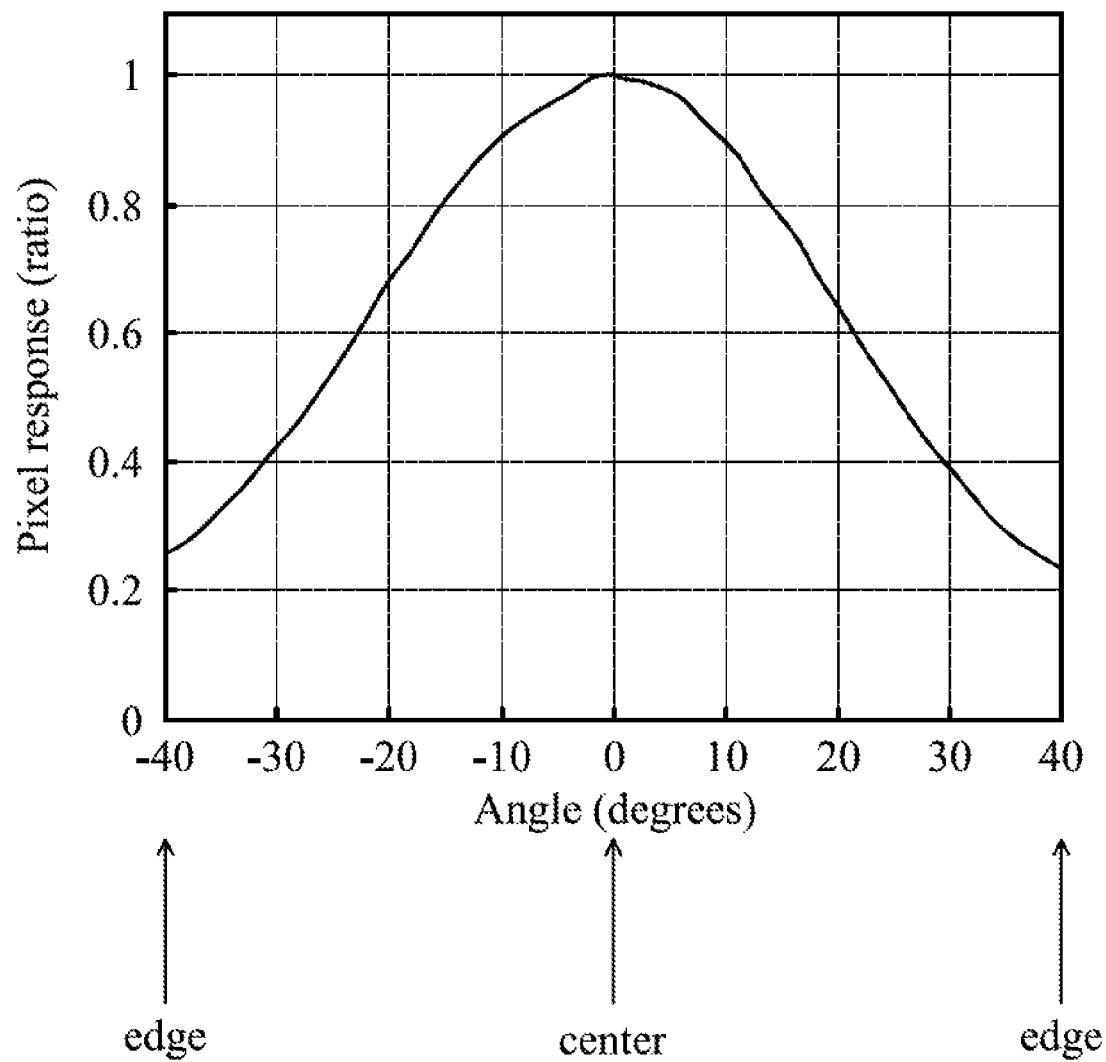
FIG. 6B shows a graph of pixel response vs. angle of an incident light radiating onto a solid-state imaging device curve with a dimensional design of a partition grid according to some embodiments of the disclosure.

FIG. 6B shows a graph of pixel response vs. angle of incident light curve with a dimensional design of a partition grid according to some embodiments of the disclosure. As shown in FIG. 6B, the pixel response is equal to 1 at the center of a pixel array irradiated by a normal incident light with an angle of 0 degrees. The pixel response is higher than 0.2 at the edges of the pixel array irradiated by an oblique incident light with an angle of +/−40 degrees.

As per the results shown in FIGS. 6A and 6B, the pixel response of FIG. 6B at the edges of the pixel array is higher than that of FIG. 6A. Moreover, the pixel response of FIG. 6B at the edges of the pixel array is symmetric. Therefore, according to dimensional designs of the partition grid of the disclosure, the angular response (AR) of the solid-state imaging devices is also improved.

According to the embodiments, the partitions of the partition grid disposed at the edges of the pixel array of the solid-state imaging device have a top width that is larger than the top widths of other partitions of the partition grid. The material of the partition grid is a low refractive index (n) material which allows the incident light to pass through the partitions and be collected by the photoelectric conversion elements of the solid-state imaging device. Therefore, the partitions disposed at the edges of the pixel array having a larger top width can enhance the sensitivity and the quantum efficiency (QE) of the pixels at the edges of the pixel array.

Moreover, in the embodiments, the partition grid has a refractive index that is lower than the refractive index of the color filter layer. Thus, a total reflection occurs at the interface between the partition of the partition grid and the color filter segment of the color filter layer. According to the embodiments, the partitions of the partition grid disposed at the edges of the pixel array of the solid-state imaging device have vertical sidewalls. The vertical sidewalls of the partitions have a total reflection angle that is greater than the total reflection angle produced by the slanted sidewalls of the partitions. The greater total reflection angle is advantageous to the photoelectric conversion elements of the solid-state imaging device collecting a greater amount of incident light. Therefore, the partitions disposed at the edges of the pixel array having vertical sidewalls can enhance the sensitivity and the quantum efficiency (QE) of the pixels at the edges of the pixel array.

Furthermore, the dimensional designs of the partitions disposed at the edges of the pixel array with larger top widths also can improve angular response (AR) of the solid-state imaging devices. Therefore, color effect and other performances of the pixels at the edges of the pixel array of the solid-state imaging devices are consistent and symmetric.

The embodiments can be used in BSI and FSI imaging devices to enhance the sensitivity and the quantum efficiency (QE) of the pixels at the edges of the pixel array and further improve the angular response (AR) of the solid-state imaging devices.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state imaging device, comprising:
a substrate containing a plurality of photoelectric conversion elements that are arranged into a pixel array;
a color filter layer including a plurality of color filter segments disposed above the photoelectric conversion elements; and
a partition grid including a plurality of partitions, each of the partitions disposed between two adjacent color filter segments, and the color filter layer and the partition grid disposed in the same layer,
wherein the partitions include a first partition disposed at a center line of the pixel array and a second partition disposed at an edge of the pixel array, the second partition has a top width that is larger than the top width of the first partition, and the second partition does not cover the plurality of photoelectric conversion elements, and
wherein the partitions from the center line to the edge of the pixel array have heights that are different from one another, and the heights of the partitions gradually increase from the center line to the edge of the pixel array.

2. The solid-state imaging device as claimed in claim 1, wherein the partition grid has a refractive index that is lower than the refractive index of the color filter layer.

3. The solid-state imaging device as claimed in claim 1, wherein the material of the partition grid comprises silicon oxide or an organic photo-resist.

4. The solid-state imaging device as claimed in claim 1, wherein the partitions from the center line to the edge of the pixel array have top widths that are different from one another, and the top widths of the partitions gradually increase from the center line to the edge of the pixel array.

5. The solid-state imaging device as claimed in claim 1, wherein the partitions have the same height from the center line to the edge of the pixel array.

6. The solid-state imaging device as claimed in claim 1, wherein each pixel of the pixel array includes one color filter segment and one partition, and the pixels of the pixel array are the same size.

7. The solid-state imaging device as claimed in claim 1, wherein partitions disposed in a first area of the pixel array have a first top width, partitions disposed in a second area of the pixel array have a second top width, an incident light irradiates the first area at an angle of 0 to ±20 degrees, the incident light irradiates the second area at an angle of greater than ±20 degrees, and the second top width is larger than the first top width.

8. The solid-state imaging device as claimed in claim 7, wherein the partitions disposed in the first area of the pixel array have a first bottom width, the partitions disposed in the second area of the pixel array have a second bottom width, the first top width is smaller than the first bottom width in the first area, and the second top width is equal to the second bottom width in the second area.

9. The solid-state imaging device as claimed in claim 1, wherein partitions disposed in a first area of the pixel array have top widths that are different from one another, partitions disposed in a second area of the pixel array have top widths that are different from one another, an incident light irradiates the first area at an angle of 0 to ±20 degrees, the incident light irradiates the second area at an angle of greater than ±20 degrees, and the top widths of the partitions in the second area are larger than the top widths of the partitions in the first area.

10. The solid-state imaging device as claimed in claim 9, wherein the top widths of the partitions in the first area and in the second area gradually increase along a direction from the center line to the edge of the pixel array.

11. The solid-state imaging device as claimed in claim 10, wherein each of the partitions in the first area of the pixel array has a bottom width that is larger than the top width of the partition, and each of the partitions in the second area of the pixel array has a bottom width that is equal to the top width of the partition.

12. The solid-state imaging device as claimed in claim 1, wherein the partitions from the center line to the edge of the pixel array have top widths that are different from one another and have bottom widths that are different from one another, the top widths of the partitions gradually increase from the center line to the edge of the pixel array, and the bottom widths of the partitions gradually decrease from the center line to the edge of the pixel array.

13. The solid-state imaging device as claimed in claim 1, wherein each of the partitions has a ratio of the top width to the bottom width, the ratios of the partitions gradually increase form the center line to the edge of the pixel array, and the ratio of the partition at the edge of the pixel array is equal to 1.

14. A solid-state imaging device, comprising:
a substrate containing a plurality of photoelectric conversion elements that are arranged into a pixel array;
a color filter layer including a plurality of color filter segments disposed above the photoelectric conversion elements; and
a partition grid including a plurality of partitions, each of the partitions surrounding one color filter segment, and the color filter layer and the partition grid disposed in the same layer,
wherein the color filter layer has an unit of multiple color filter segments, one color filter segment in the unit is surrounded by a first partition on all sides of the one color filter segment, the other color filter segment in the unit is surrounded by a second partition on all sides of the other color filter segment, and the first partition has a top width that is larger than the top width of the second partition.

15. The solid-state imaging device as claimed in claim 14, wherein the color filter segment surrounded by the first partition has a color that is different from the color of the other color filter segment surrounded by the second partition.

16. The solid-state imaging device as claimed in claim 14, wherein the second partition has a ratio of the top width to the bottom width, the first partition has a ratio of the top width to the bottom width, and the ratios of the first and second partitions are equal to 1.

17. The solid-state imaging device as claimed in claim 14, wherein the second partition has a ratio of the top width to the bottom width and the ratio of the second partition is smaller than 1, and the first partition has a ratio of the top width to the bottom width and the ratio of the first partition is equal to 1.

18. The solid-state imaging device as claimed in claim 14, wherein the partition grid and the color filter layer have the same height.

19. The solid-state imaging device as claimed in claim 14, wherein each pixel of the pixel array includes one color filter segment and one partition, and the pixels of the pixel array are the same size.

* * * * *